United States Patent [19]
Matsumoto et al.

[11] Patent Number: 5,655,150
[45] Date of Patent: Aug. 5, 1997

[54] RECORDING DEVICE HAVING ALTERNATIVE RECORDING UNITS OPERATED IN THREE DIFFERENT CONDITIONS DEPENDING ON ACTIVITIES IN MAINTENANCE DIAGNOSIS MECHANISM AND RECORDING SECTIONS

[75] Inventors: Toshio Matsumoto; Hiroshi Baba, both of Kanagawa-ken, Japan

[73] Assignee: Mitsubishi Denki Kabushiki Kaisha, Tokyo, Japan

[21] Appl. No.: 390,820

[22] Filed: Feb. 16, 1995

Related U.S. Application Data

[63] Continuation of Ser. No. 865,137, Apr. 8, 1992, abandoned

[30] Foreign Application Priority Data

Jul. 17, 1992 [JP] Japan .................... 3-078904

[51] Int. Cl.$^6$ .................... G06F 13/00; G06F 11/00
[52] U.S. Cl. .................... 395/837; 395/826; 395/835; 395/838; 395/839; 395/441; 395/182.05
[58] Field of Search .................... 364/200; 371/10.1; 395/275, 325, 575, 837, 826, 835, 838, 839, 441, 182.05

[56] References Cited

U.S. PATENT DOCUMENTS

| | | | |
|---|---|---|---|
| 4,268,905 | 5/1981 | Johann et al. | 395/500 |
| 4,761,785 | 8/1988 | Clark et al. | 371/51 |
| 4,916,605 | 4/1990 | Beardsley et al. | 364/200 |
| 5,083,266 | 1/1992 | Watanabe | 395/275 |
| 5,088,081 | 2/1992 | Farr | 369/54 |
| 5,101,492 | 3/1992 | Schultz et al. | 395/575 |
| 5,127,088 | 6/1992 | Takaki | 395/275 |
| 5,148,432 | 9/1992 | Gordon et al. | 371/10.1 |
| 5,210,860 | 5/1993 | Pfeffer et al. | 395/575 |
| 5,249,279 | 9/1993 | Schmenk et al. | 395/425 |
| 5,345,565 | 9/1994 | Jibbe et al. | 395/325 |
| 5,402,428 | 3/1995 | Kakuta et al. | 371/10.1 |

FOREIGN PATENT DOCUMENTS

| | | |
|---|---|---|
| 0086886A3 | 8/1983 | European Pat. Off. . |
| 0086886 | 8/1983 | European Pat. Off. . |
| 0294287 | 12/1988 | European Pat. Off. . |
| 0369707 | 11/1989 | European Pat. Off. . |
| 0369707A3 | 5/1990 | European Pat. Off. . |
| 0369707 | 5/1990 | European Pat. Off. . |
| 0369707A2 | 5/1990 | European Pat. Off. . |
| 0385836 | 9/1990 | European Pat. Off. . |
| 0502207 | 9/1992 | European Pat. Off. . |
| 60-179863 | 9/1985 | Japan . |
| 63-279318 | 11/1988 | Japan . |
| WO89/10594 | 11/1989 | WIPO . |
| WO90/00280 | 1/1990 | WIPO . |

OTHER PUBLICATIONS

"A Case for Redundant Arrays of Inexpensive Disks" David A. Patterson, Garth Gibson & Randy H. Katz, Dec., 1987.
IEEE 1988 "The IBM 3990 Disk Cache" Jai Menon & Mike Hartung pp. 146–151.

(List continued on next page.)

*Primary Examiner*—Thomas C. Lee
*Assistant Examiner*—Le Hien Luu
*Attorney, Agent, or Firm*—Wolf, Greenfield & Sacks, P.C.

[57] ABSTRACT

A recording device which improves a response time to write data by reporting to a host computer the completion of writing operation prior to the completion of writing redundancy data. Data writing command information from the host computer is stored in a command/status memory backed up by a power source in an array controller, and the completion of writing operation is reported to the host computer at the time of the completion of writing updated data prior to the completion of writing redundancy data. Redundancy data is written as a background process. If redundancy data could not be written due to any abnormality of the power source or the like, such redundancy data may be generated from the data in other disk units of the same redundancy group in accordance with writing command information stored in the command/status memory, thereby completing the writing of redundancy data.

7 Claims, 10 Drawing Sheets

OTHER PUBLICATIONS

Jai Menon & Mike Hartung "The IBM 3990 Disk Cache" IEEE 1988 pp. 146–151.

IBM Technical Disclosure Bulletin, Dec., 1989.

IBM Technical Disclosure Bulletin, Jan., 1991.

T. Oyama, et al "F6490 Magnetic Disk Subsystem: DIA" Fujitsu Scientific & Technical Journal, Winter 1990. pp. 291–295.

IBM Technical Disclosure Bulletin, Oct., 1989.

R.Muntz & J.Lui "Performance Analysis of Disk Arrays Under Failure" pp. 162–173.

J.Gray, et al "Parity Striping of Disc Arrays: Low–Cost Reliable Storage w/Acceptable Throughput", Tandem Computers, Inc. 1990.

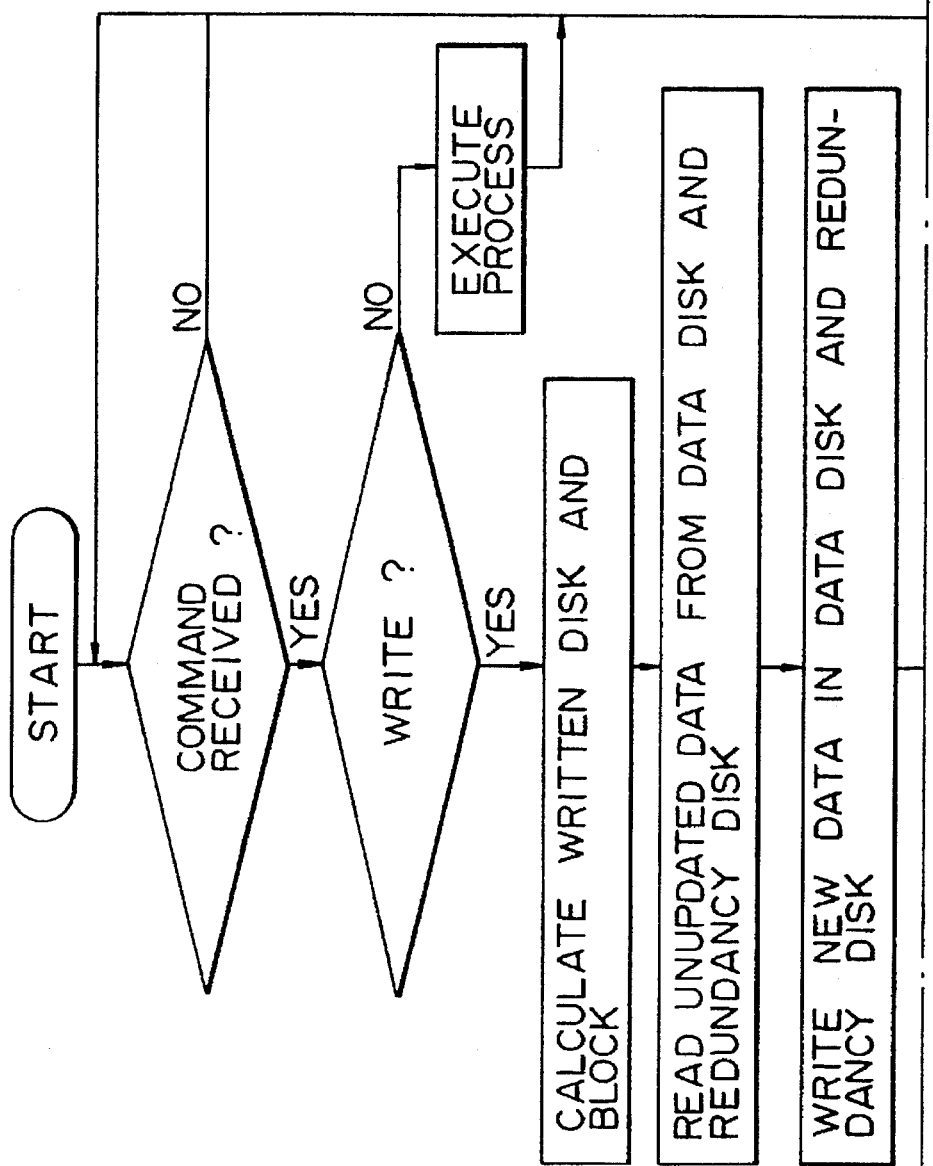

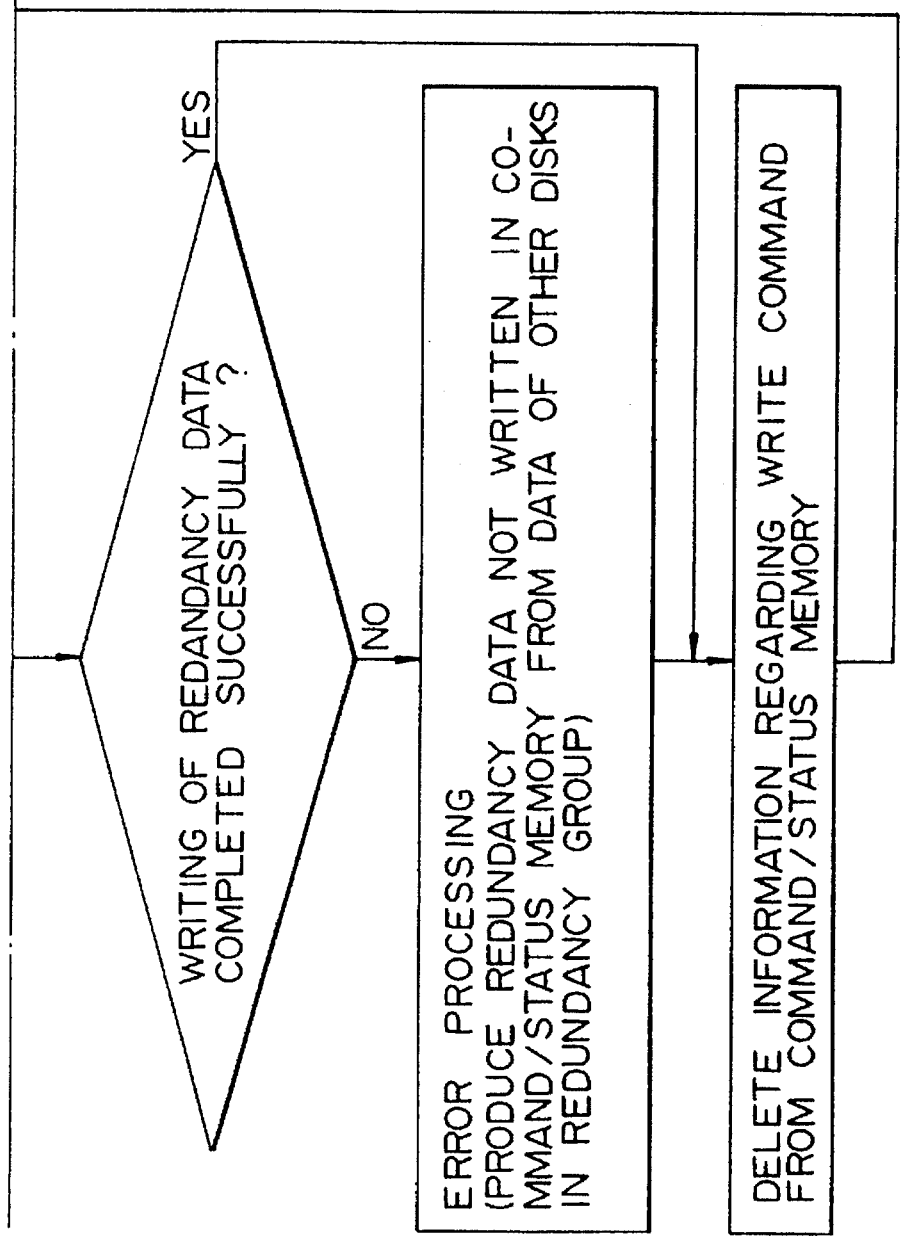

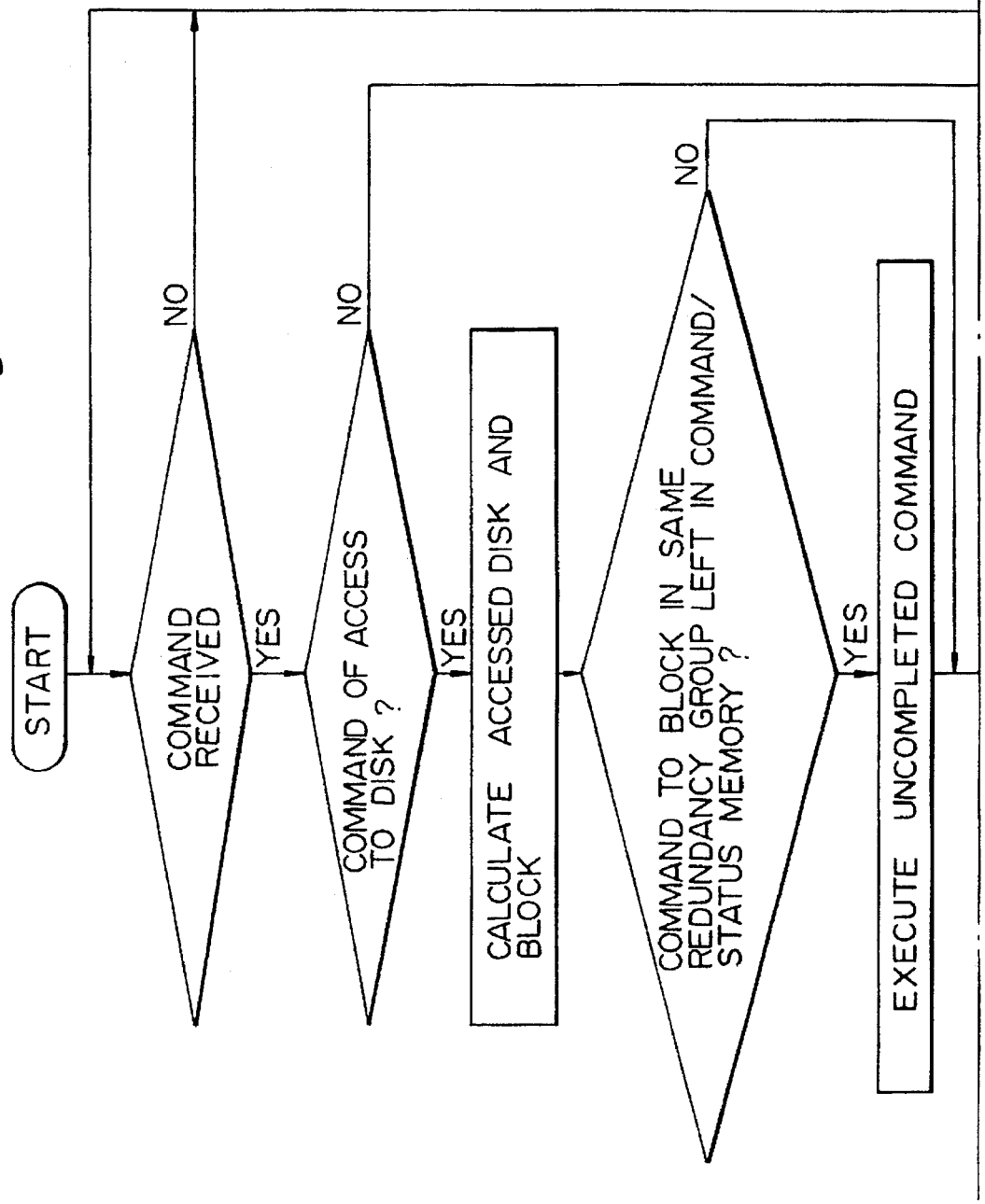

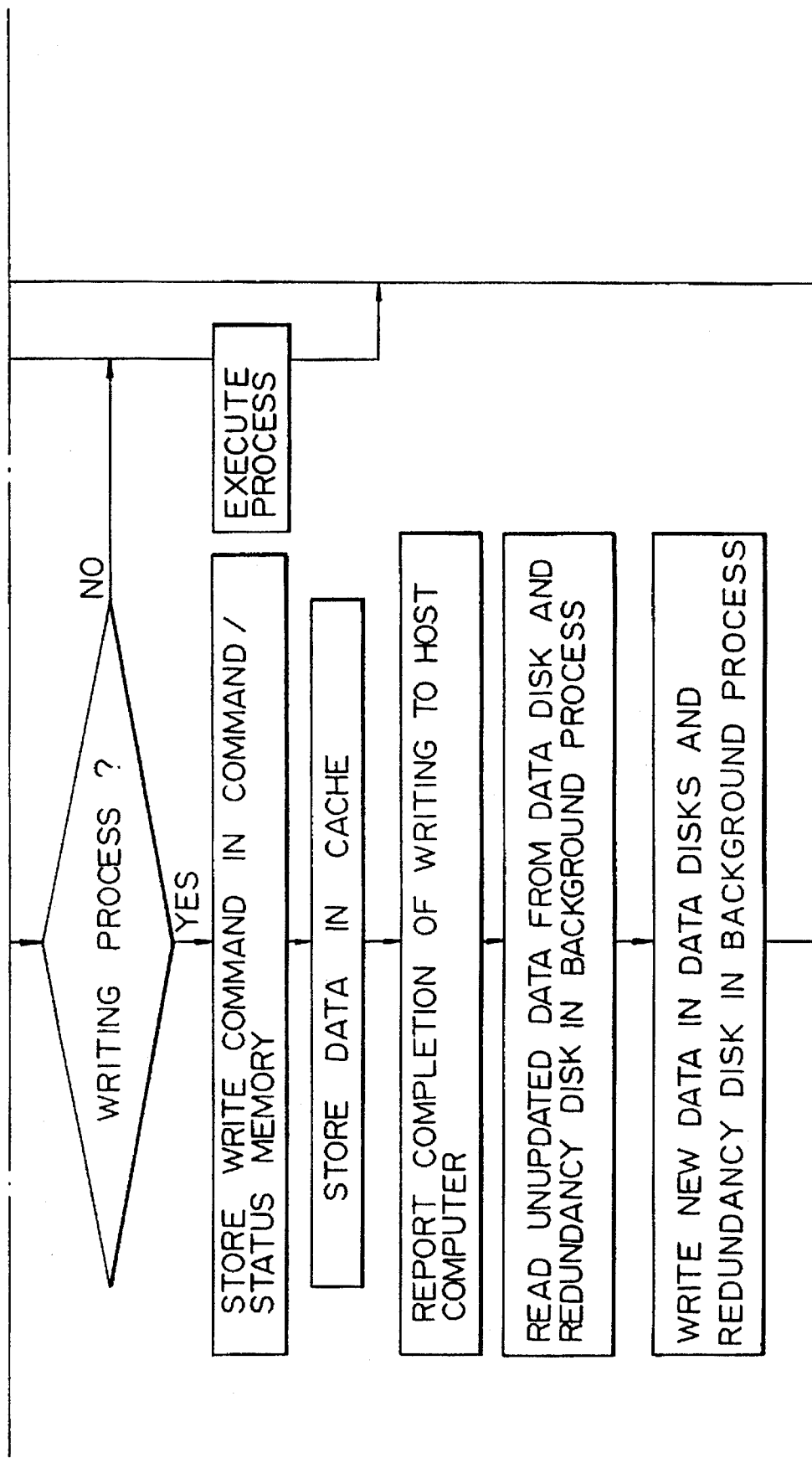

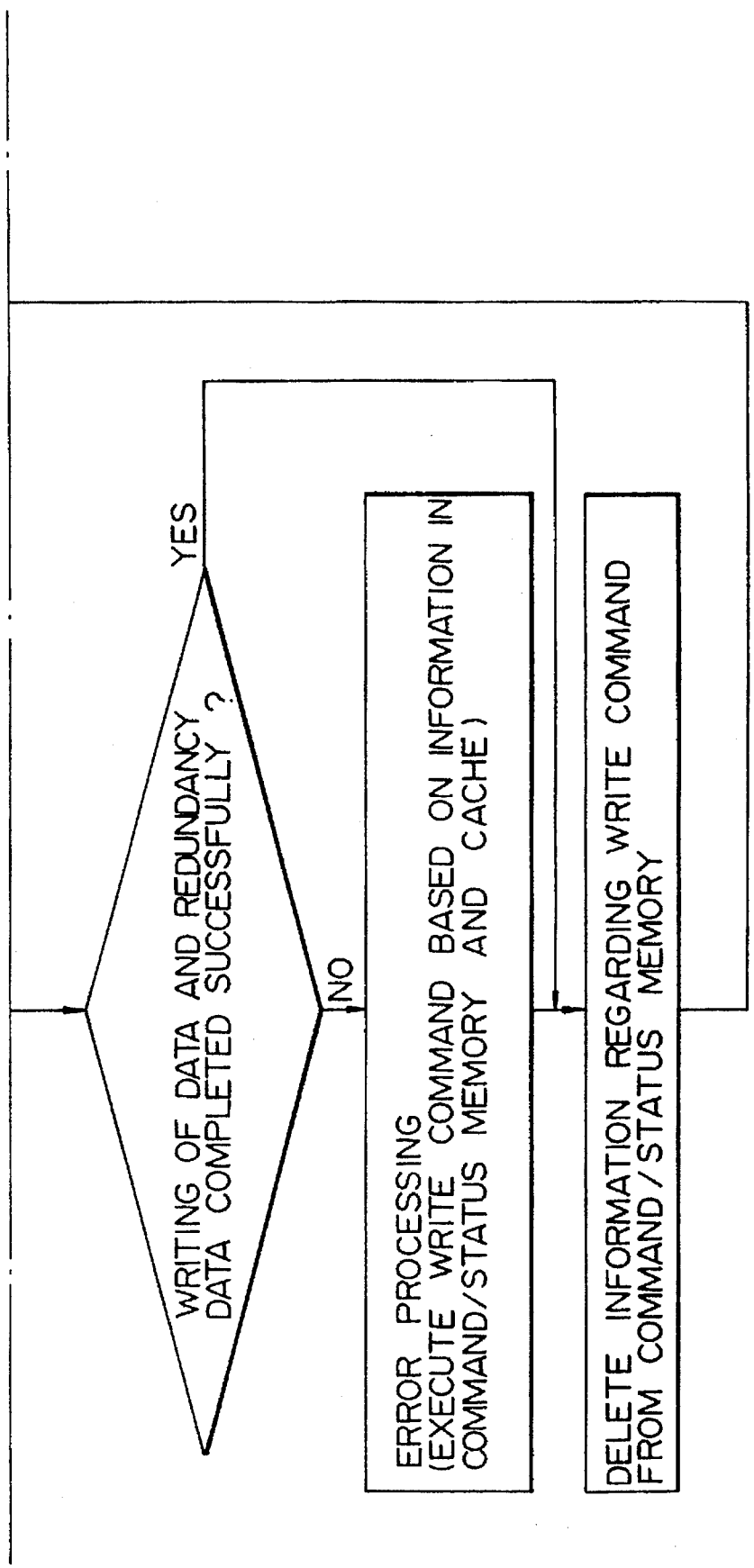

RECORDING DEVICE HAVING ALTERNATIVE RECORDING UNITS OPERATED IN THREE DIFFERENT CONDITIONS DEPENDING ON ACTIVITIES IN MAINTENANCE DIAGNOSIS MECHANISM AND RECORDING SECTIONS

This application is a continuation of application Ser. No. 07/865,137, filed on Apr. 8, 1992, now abandoned.

BACKGROUND OF THE INVENTION

1. Field of the Invention

The present invention relates to a recording device and an array-type recording device for use as a storage system in a computer, and, more particularly, to an improvement in the performance and reliability of a disk drive system having a plurality of disk units arranged in an array.

2. Description of the Prior Arts

A variety of literatures and patents have disclosed disk systems comprising a plurality of disk units arranged in an array. Of these literatures, an article titled "A Case for Redundant Arrays of Inexpensive Disks (RAID)", Proc. ACM SIGMOD Conf., Chicago, Ill., June, 1988 published by The Berklay Institute of the University of California describes a method of dramatically improving the reliability of stored data. The article proposed classifying a method of improvement in data reliability into five levels. These range from a conventional mirror disk system to a block interleave parity system. Outlines of the respective levels are described as follows.

RAID level 1

This is of a conventional mirror (shadow) system wherein identical data are stored in two groups of disk unit. The system according to RAID level 1 has been generally employed in systems requiring a high level of reliability. However, redundancy is considerable and the cost for unit capacity is accordingly high.

RAID level 2

A hamming code type which is used in a DRAM is applied to this level. Data are stored in data disks for a redundancy group in a bit interleaving manner. In the meantime, in order to enable correction of one bit error to be executed, ECC codes are written in a plurality of check disks for one group (one group comprising 10 to 25 sets of disks). Four check disks are required for ten sets of data disks. Redundancy is considerable.

RAID level 3

Predetermined parity disks are used and data are recorded in data disks of a certain group in a byte interleaving manner. Since error positions can be located by an ECC for each drive, one set of parity disks may be needed. This system is suitable for a high speed transfer by synchronously rotating spindles.

RAID level 4

Predetermined parity disks are used and data are recorded in data disks of a certain group in a block interleaving manner. A difference between RAID level 4 and RAID level 3 is that a different interleave unit is used in level 4. More specifically, since data are recorded in each block, this system is suitable for a case where a small volume of data is frequently accessed.

RAID level 5

Unlike the afore-said levels 3 and 4, predetermined parity disks are not provided. Parity data are dispersedly stored, i.e., striped in constituent disks. As a consequence, at the time of writing operation, parity disks are not subjected to concentrated loads and IODS may be increased (The greater the rate of writing, the more advantageous will be this system compared to RAID level 4). Performance at the time of use as well as a capacity efficiency are desirable.

An example of a conventional array-type recording device having redundancy is disclosed in Japanese Patent Laid-Open Publication No. 236714/90 wherein a system and method of driving array-type disks are disclosed. In this system, a redundancy level and a logical number of component disk units viewed from a host computer can be selected.

With reference to the striping of parity data, Japanese Patent Laid-Open Publication No. 293356/87 discloses a data protection mechanism and a method thereof.

FIG. 1 illustrates the constitution of a conventional array-type recording device which has been disclosed in afore-said Japanese Patent Laid-Open Publication No. 236714/90. In FIG. 1, the reference numeral 1 designates a host computer; 2 a host interface (hereinafter called Host I/F) which serves as a buffer between host computer 1 and an array controller 13; 3 a microprocessor adapted to control the whole array controller 13; 4 a memory; 5 an ECC engine adapted to generate redundancy data and reconstruct data; 6 a data path commonly connected to host I/F 2, microprocessor 3, memory 4 and ECC engine 5; 7 a CE panel; and 8a through 8e channel controllers. CE panel 7 and the plurality of channel controllers 8a–8e are connected to data path 6. The reference numerals 9a–9e designate disk units; and 10 channels, through which the plurality of disk units 9a–9e are connected to channel controllers 8a–8e; 11 stand-by disks; 12 spare channels, through which plurality of stand-by disks 11 are connected to channel controller 8; and 13 an array controller for controlling plurality of disk units 9a–9e and stand-by disk 11.

Operation of the illustrated recording device will next be explained. In FIG. 1, data are recorded and reproduced by host computer 1 through host I/F 2. Upon storage of data, commands and data from host computer 1 are stored in memory 4 by way of data path 6. Upon reproduction of data, the data stored in memory 4 is transferred to host computer 1 by way of host I/F 2.

Operation of the recording device in the case of RAID level 5 will now be explained. The data stored in memory 4 is divided by microprocessor 3 into data blocks, and disk units in which data is to be written and disk units in which redundancy data is to be written are determined. In RAID level 5, since old data stored in a data block corresponding to the writing operation is required for updating redundancy data, a reading operation is executed prior to the writing operation. Data is transferred between memory 4 and channel controllers 8, 8a–8e by way of data path 6, and redundancy data is generated by ECC engine 5 synchronously with the transfer of data.

For example, in the case of writing data of 1024 byte long, assuming that a data block is set at 512 byte long, the data of 1024 byte long is striped into two blocks whereby writing-data disk units 9a, 9b and a redundancy-data disk unit 9e are determined. Next, under the control of microprocessor 3, ECC engine 5 is activated and a command to read out old data for computing redundancy data is provided to channel controllers 8a, 8b and 8e to which data disk units 9a, 9b and redundancy-data disk unit 9e are connected. After reading the old data out of data disk units 9a, 9b and redundancy-data disk unit 9e, new data is written in data disk units 9a, 9b in accordance with a command from microprocessor 3, and updated redundancy data generated by ECC engine 5 is written in redundancy-data disk unit 9e. Then, the completion of the data writing operation is reported to host computer 1. As described above, upon writing data, old data must be read out in advance for the purpose of generating redundancy data, resulting in a longer processing time.

Reading out data will next be explained. When a data reading command is issued from host computer 1, the data block and the data disk unit in which relevant data is stored are computed by microprocessor 3. For example, if relevant data is stored in disk unit 9c, a command to read the data is issued to channel controller 8c to which disk unit 9c is connected. When the reading of the data from disk unit 9c is completed, the read data is transferred to memory 4 and the completion of reading the data is reported to host computer 1.

Reconstruction of data at the time of occurrence of abnormality and reconstruction of data in stand-by disks will next be explained. Reconstruction of data is executed when, for example, the reading of data out of disk unit 9c becomes impossible. In such a case, data are read by microprocessor 3 from all the disk units of a redundancy group which include the data blocks to be read out by microprocessor 1 and the data of the data blocks corresponding to the data which were unable to be read out are reconstructed by ECC engine.

For example, if the redundancy group includes disk units 9a, 9b, 9c and 9e, data blocks are read from disk units 9a, 9b, and 9e and data are reconstructed in disk unit 9c by ECC engine 5. The reconstructed data are then transferred to memory 4 and the completion of data reading operation is communicated to host computer 1. It is understood that, even if it becomes impossible to read out data due to an abnormality in a disk unit, data can be reconstructed, resulting in the enhancement of data storage reliability.

Reconstruction of data may be executed when, for example, disk unit 9c becomes disabled. In this case, data is read out by microprocessor 3 from all the disk units of the redundancy group which include the data stored in disk unit 9c, and data for disk unit 9c is reconstructed by ECC engine 5. The reconstructed data is reconstructed in any of the stand-by disks.

If the redundancy group is composed, for example, of disk units 9a, 9b, 9c and 9e, then data are read out from disk units 9a, 9b and 9e, while data for disk unit 9c is reconstructed by ECC engine 5. The reconstructed data is written on any one of stand-by disks 11, while the data for disk unit 9c is reconstructed in stand-by disk 11. In this way, disk unit 9 which has been disabled may be replaced with stand-by disk 11. It is to be noted, however, that, during the replacement of disk unit 9c with stand-by disk 11, if any abnormality occurs in stand-by disk 11, such a replacement process becomes complicated. Furthermore, since such a replacement process is executed while the system is in operation, the performance of the system will be degraded during such a replacement process.

Since a conventional array-type recording device is constituted such as described above, the prior art device has serious problems in that, due to the necessity of reading out data in advance for generating redundancy data at the time of a data writing operation even in a normal operation of the system, a processing time becomes correspondingly slower.

The conventional device has a further problem in that, during a process of replacement of disks in the case of abnormality, if a stand-by disk used for replacement is damaged, the performance of the system is further degraded.

The conventional device has still another problem in that a possibility of a fault existing in channels to which constituent disks are connected is not taken into consideration.

SUMMARY OF THE INVENTION

The present invention has been proposed to eliminate the problems as described above, and an object of the present invention is to provide a recording device and an array-type recording device which improve a processing time at the time of data writing operation.

A further object of the present invention is to provide a reliable recording device and a reliable array-type recording device which make it possible to detect abnormality of stand-by disks prior to a replacement process and further take into account any fault in channels to which constituent disk units are connected.

The present invention according to the first aspect provides a recording device including:

(a) an interface section serving as an interface with a main unit such as a host computer;

(b) a recording means for recording data;

(c) a redundancy providing means for providing redundancy for recorded data; and (d) a control section for causing data to be recorded in the recording means in accordance with a data recording request from the main unit by way of the interface section, said control section adapted to report to the main unit the completion of data recording operation by way of the interface section and cause redundancy data provided by the redundancy providing means to be recorded in the recording means.

In this way, since the control section is designed to report the completion of operation prior to the writing of redundancy data in response to a writing request from the main unit, a writing process time can be shortened.

The present invention according to the second aspect provides an array-type recording device including:

(a) an interface section for serving as an interface with a main unit such as a host computer;

(b) a recording means having a plurality of recording sections arranged in an array for recording data;

(c) a non-volatile memory for storing information; and (d) a control section for causing a recording request from the main unit by way of the interface section to be recorded in the non-volatile memory before reporting to the main unit the completion of data recording operation by way of the interface section, and for causing data to be recorded in any one of the recording sections of the recording means in accordance with the recording request stored in the non-volatile memory.

In this way, the control section causes data to be written into the non-volatile memory in response to a data writing request from the main unit and reports to the main units the completion of data writing operation, thereby shortening a writing process time.

The present invention according to the third aspect provides a recording device including:

(a) a recording means having a plurality of recording sections arranged in an array for recording data;

(b) a redundancy providing means for generating redundancy data in accordance with recorded data; and (c) a control section for causing data to be striped and recorded in at least one recording section of the recording means, and for altering a recording section for writing data in accordance with the number of recording sections which have already recorded the striped data and the number of recording sections in which new data are written to cause obtained data to be provided to the redundancy providing means for generating redundancy data.

In this way, at the time of writing data, since the control section alters recording sections which read out data first and which are necessary for generating redundancy data in accordance with the number of recording sections subjected to writing operation, a fewer number of first reading recording sections necessary for generating redundancy data may be read out, whereby a reading time may be saved, resulting in quick generation of redundancy data from the redundancy providing means.

The present invention according to the fourth aspect provides an array-type recording device including:

(a) a recording means having a plurality of recording sections arranged in an array for recording data;

(b) a plurality of data transfer means connected to the recording sections of said recording means; and (c) a control section for selecting another data transfer means through which data are transferred, when an access through one of the plurality of data transfer means to the recording means is in error.

In this way, the data transfer means connects the recording sections with the array controller by way of a plurality of channels, and, if an access to a recording section from the array controller via one of the channels fails, the control section is designed to provide an access to the recording section by way of another channel, whereby system reliability may be enhanced. More specifically, since each recording section is connected via a plurality of channels to the array controller, even if access through one channel to the recording section fails, access through another channel to the recording section is possible, thereby enhancing system reliability.

The present invention according to the fifth aspect provides a recording device including:

(a) a recording means having a plurality of recording sections arranged in an array for recording data;

(b) a plurality of data transfer means connected to the recording sections of the recording means; and (c) a control section for selecting an unused data transfer means for data transfer when one of the plurality of data transfer means is already occupied.

In this way, the data transfer means connects the recording sections with a plurality of channels, and, when access is made from the array controller to a recording section by way of one of the channels, if that channel is occupied by an access to other recording section, the control section causes access to be made to the recording section by way of another channel, whereby accessibility may be enhanced. More specifically, since each recording section is connected by way of a plurality of channels, if a channel connected to a certain recording section is occupied and access to the recording section connected to the occupied channel is made, the control section identifies an unused channel so as to enable access to the recording section.

The present invention in accordance with the sixth aspect provides a recording device including:

(a) recording sections for recording data;

(b) alternative recording units usable in place of the recording sections; and (c) a maintenance diagnosis means for diagnosing the alternative recording units to decide whether the alternative recording units can be used or not.

In this way, the maintenance diagnosis means is designed to periodically or non-periodically make diagnosis of such alternative recording units replaceable with the recording sections in the case of fault in any recording section, and detect abnormality of the alternative recording units, consequently, the alternative recording units can be used in the case of abnormality of any of the recording sections and disables the faulty recording sections so as to separate them from the system, thereby improving reliability.

The present invention according to the seventh aspect provides a recording device including:

(a) recording sections for recording data;

(b) alternative recording units usable in place of the recording sections;

(c) an error recording section for recording error information at the time of recording data in and reproducing data from recording section; and (d) a maintenance diagnosis means for deciding whether any recording section should be replaced with the alternative recording units or not in accordance with the error information recorded in the error recording means.

In this manner, the error recording means is designed to collect and record error information when the system is in operation, and the maintenance diagnosis means is designed to decide if any recording section in which an error exceeding a predetermined level has occurred is faulty, whereby a faulty recording section is replaced with alternative recording units and the faulty recording section is separated from the system. Therefore, there is no possibility of concurrent faults occurring in a plurality of recording sections, thereby improving a system reliability.

The present invention according to the eighth aspect provides an array-type recording device including:

(a) a recording means having a plurality of recording sections arranged in an array for recording data;

(b) alternative recording units usable in place of the recording sections;

(c) a control section for causing data to be striped, recorded in and reproduced from the recording sections, and for causing data in the recording section to be replaced with the alternative recording unit at the time of an access to the data recorded in the recording section.

In this way, the control section is designed, when any recording section is damaged and the damaged recording section should be replaced with any alternative recording unit while the system is in operation, reconstructed and unreconstructed areas when access is made to the unreconstructed area of the faulty recording section or when access is made to an area of another recording section of the same redundancy group involved in the unreconstructed area of the faulty recording section. As a result, the entire process of completing the data reconstruction may be shortened. Furthermore, if the completion of data reconstruction is reported to the main unit before the reconstruction in the alternative recording unit, a response time can be made shorter.

The present invention according to the ninth aspect provides an array-type recording device including:

(a) a recording means having a plurality of recording sections arranged in an array for recording data;

(b) a control section causing data to be striped, recorded in and reproduced from the recording sections;

(c) alternative recording units usable in place of the recording sections; and (d) a means for recording correct data of said recording means in any of the alternative recording units.

In this way, when a recording section is damaged and the faulty recording section is replaced with an alternative recording unit, if data can be read out of a faulty recording section without error, the read data is used for data reconstruction. Consequently, data reconstruction can be made faster than in the case of utilizing data which has been reconstructed from data stored in other recording sections of the redundancy group.

BRIEF DESCRIPTION OF THE DRAWINGS

FIG. 4 which consists of FIGS. 4A, 4B, and 4C together is a flow chart showing another operation of the embodiment shown in FIG. 2;

DETAILED DESCRIPTION OF THE PREFERRED EMBODIMENTS

Figure 1:
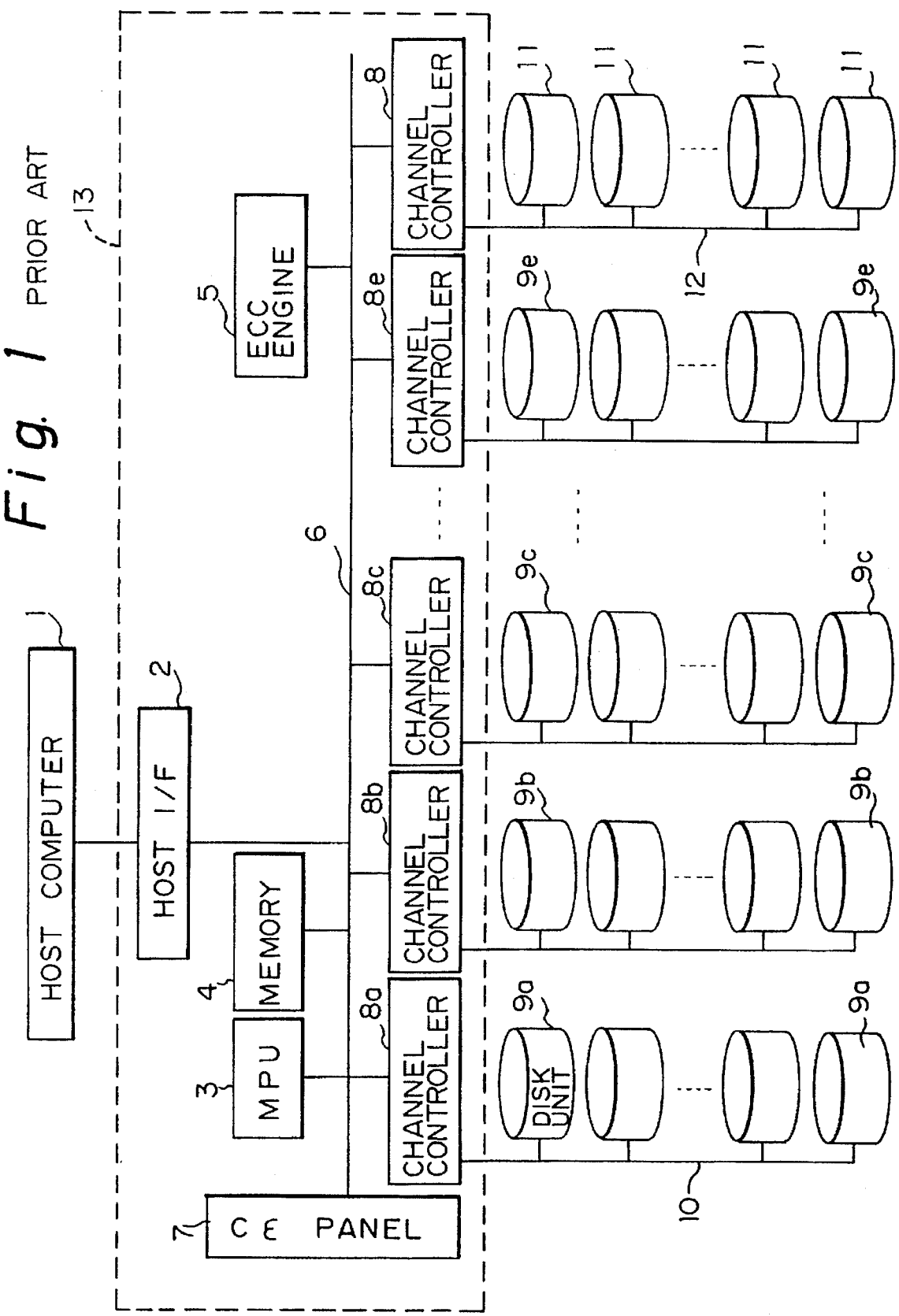
FIG. 1 illustrates the constitution of an array-type recording device according to the prior art.
Figure 2:
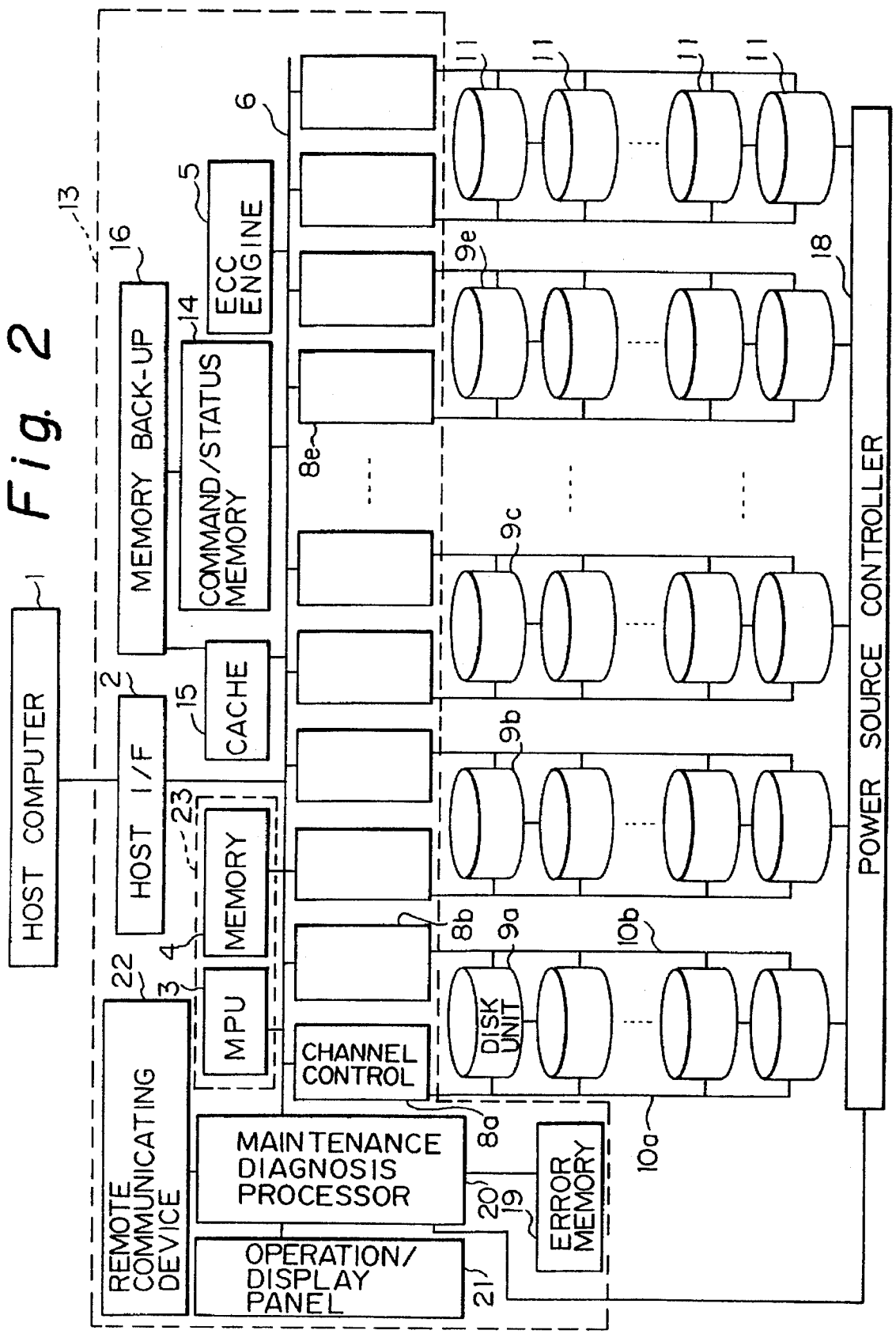
FIG. 2 illustrates the constitution of a preferred embodiment of an array-type recording device according to the present invention.

Embodiments of the present invention will now be explained by referring to FIG. 2 through FIG. 6. In FIG. 2, the reference numeral 1 designates a host computer; 2 a host I/F (an interface section) which serves as a buffer between host computer 1 and an array controller 13; 3 a microprocessor which controls the whole array controller 13; 4 a memory in which programs, data and the like used in microprocessor 3 are stored; 5 an ECC engine (a redundancy providing means) adapted to detect errors in data which pass through data path 6 and encode and decode the corrected data; 8a through 8e channel controllers which provide control between the array controller and disk units; 9 disk units (recording sections) in which data are stored; 10a and 10b channels; 11 stand-by disks (alternative recording units) which are spare disk units; 14 a command/status memory comprising a RAM which hold commands transmitted from host computer 1 and a status representing a processing state; 15 a cache which holds data sent from host computer 1 and data read from disk units 9, command/status memory 14 and cache 15 being backed up by a memory back-up mechanism 16 comprising a secondary power source such as a battery; 18 a power source control device for supplying power and providing control to disk units 9 and stand-by disks 11; 20 a maintenance diagnosis processor adapted to monitor, as a maintenance diagnosis means, array controller 13, disk units 9 and stand-by disks 11 and cause error information to be stored in an error storage means 19 in case of abnormality and to be displayed on a display panel 21; and 22 a remote communicating device adapted to inform a maintenance center (not shown) of error information or the like. Microprocessor 3 and memory 4 form a control section 23 and microprocessor 3 is operated by programs and data stored in memory 4 so as to control array controller 13 and the entire system.

Figure 3B:
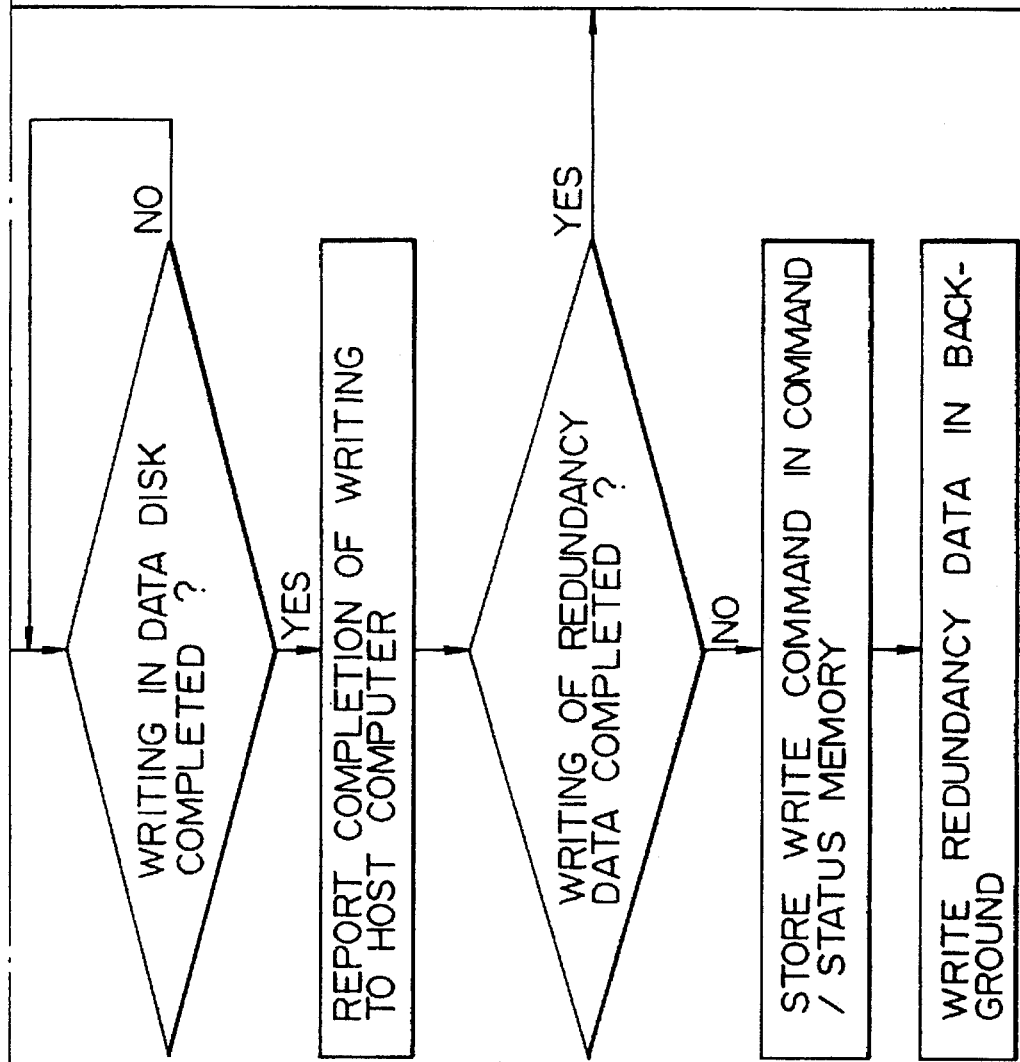
FIG. 3 which consists of FIGS. 3A, 3B, and 3C together is a flow chart showing one operation of the embodiment shown in FIG. 2.

Operation of the device shown in FIG. 2 will now be explained. FIG. 3 is a flow chart showing operation of the device illustrated in FIG. 2. When the array-type recording device receives a writing request from host computer 1, microprocessor 3 causes data to be read from data blocks of writing-data disk units and data blocks of redundancy-data disk units in accordance with a predetermined data arraying form.

For example, if data disk unit 9a and redundancy disk unit 9e are designated, ECC engine 5 is activated under the control of microprocessor 3 and a command to read old data used for the purpose of computing redundancy data is issued to channel controllers 8a and 8e to which data disk unit 9a and redundancy data disk unit 9e are respectively connected. After old data have been read out from data disk unit 9a and redundancy data disk unit 9e, new data is written into data disk unit 9a by a command from microprocessor 3 and new redundancy data produced by ECC engine 5 (obtained, for example, in RAID level 5, by an exclusive-OR operation of old data Do read from and new data Dn stored in data disk unit 9a and old redundancy data Po read from redundancy data unit 9c, that is, Pn=Do+e,crc ++ee Dn+e,crc ++ee Po where +e,crc ++ee represents an exclusive-OR operation) is written in redundancy data disk unit 9e. In this case, when the writing of the new data is finished, microprocessor 3 informs host computer 1 of the completion of data writing operation prior to the completion of writing the new redundancy data. Subsequently, if the writing of the redundancy data is not yet completed, microprocessor 3 causes such a writing operation to be continued as a background process.

In this manner, since the completion of data writing operation is reported to host computer 1 prior to the completion of writing new redundancy data in a redundancy disk unit, seemingly high speed writing operation may be achieved.

Information as to which block data is to be written in is stored in command/status memory 14 for the preparation of abnormality of the power source as well as the system. Even if an abnormality occurs in the power source or the system, redundancy data may be generated and written in a redundancy disk unit at the time of system restart by data from other disk units of the redundancy group in accordance with the information stored in command/status memory 14 backed up by memory back-up mechanism 16, whereby the writing operation may be completed. The information on command/status memory 14 is cancelled when a redundancy data writing process is completed. It is to be noted that, if command/status memory 14 becomes full, the writing of redundancy data is completed prior to other processes.

In this embodiment, information as to which block data is to be written in is stored in command/status memory 14. However, such information as well as redundancy data may be stored in memory 14. In the latter case, redundancy data may be directly written in a redundancy disk unit at the time of system restart based on the information stored in command/status memory 14 and it is unnecessary to generate redundancy data based on data from other disk units of the redundancy group as in the above-described embodiment.

As explained above, since the completion of data writing operation is reported to host computer 1 prior to the completion of writing new redundancy data in a redundancy disk unit, a seemingly high speed writing operation may be achieved, and, even if an abnormality occurs in the power source and the system, a writing operation can be completed, resulting in no contradiction of data.

As explained above, according to the present invention, there is provided an array-type recording device which has a plurality of disk units arranged in an array for storing and reproducing data for a computer system, the array-type recording device having redundancy providing means for providing redundancy data for data to be written by a computer into the array-type recording device and being capable of reporting to the computer the completion of data writing operation prior to the completion of writing redundancy data generated by the redundancy providing means.

FIG. 4 is a flow chart showing other operation performed in the device shown in FIG. 2. When the array-type recording device receives a writing request from host computer 1, microprocessor 3 causes the command to be stored in command/status memory 14. After having stored data subsequently sent from host computer 1 in cache 15, microprocessor 3 reports to host computer 1 the completion of data writing operation. Subsequently, microprocessor 3 causes data to be written into a disk unit in accordance with the command as a background process.

In this operation, task execution status which is necessary for writing data and status information sent from a disk unit are stored in command/status memory 14 in preparation for a power source failure or a system error. Should any abnormality occur in the power source or the system, the writing of data into a disk unit may be actually completed after a system restart in accordance with information stored in a cache 15 and command/status memory 14 backed up by memory back-up mechanism 16. The information stored in command/status memory 14 is cancelled upon completion of writing all data.

It is to be understood that if command/status memory 14 becomes full, the writing of data may be actually completed prior to other processes. In the case where cache 15 becomes full, FIFO may be used alternatively.

It is also to be noted that, upon receiving a command from host computer 1, it is decided if writing command information in a block of the same redundancy group as the read block is included in command/status memory 14, and if such information is decided to be included in memory 14, the writing of such information is actually completed before other processes.

In this way, the completion of writing operation is reported to host computer 1 before actually writing data into a disk unit, whereby a seemingly high speed writing operation may be attained. Further, even in the case of occurrence of failure in the power source and the system, the writing of data can be definitely completed, thus avoiding any contradiction of data.

As explained above, according to the present invention, there is provided an array-type recording device having a plurality of disk units arranged in an array for storing and reproducing data in a computer system, the array-type recording device including a redundancy providing means for providing redundancy and a non-volatile memory. In the case where data from the computer are written in the array-type recording device, the writing of data in the non-volatile memory is reported to the host computer as the completion of writing the data in the recording device.

According to the present invention, there is also provided an array-type recording device having a non-volatile memory for storing commands from a computer system and internal processing state of the array-type recording device, wherein, when any abnormality occurs in the array-type recording device, a command from the computer system may be executed again or data may be reconstructed in accordance with the information stored in the non-volatile memory.

The non-volatile memory may comprise a RAM backed up by a secondary power source such as a battery, thereby enabling a part of RAM memories in the recording device can be utilized as the non-volatile memory. That is, no additional non-volatile memory will be required, and the disk drive device can be fabricated inexpensively and easily.

It is to be understood that, in stead of constituting command/status memory 14 and cache 15 with RAM, they can be also constituted with normal non-volatile memories such as EEPROMs.

Although command/status memory 14, cache 15 and memory 4 are separate in the embodiment shown in FIG. 2, they can be made of sections of one or more memories.

In RAID levels 4 and 5, when data is written, old data to be updated is read out of a data disk unit and a redundancy disk unit, and, after the generation of new redundancy data, new data and the new redundancy data are written. However, in case that the size of data to be written is too large, such data occupies a plurality of data disk units when written. In such an instance, new redundancy data can be possibly generated faster if data is read from a disk unit of the same redundancy group in which no data is written.

For example, in the case of a system allowing at least one damaged disk unit in a redundancy group to be recovered, assuming that the redundancy group includes (N+1) disk units and a piece of data is written in M disk units, it is normally necessary to read old data from (M+1) disk units for generating the redundancy data. By comparing the old data with new data, ECC engine 5 can generate new redundancy data.

As another method of generating redundancy data, it is possible to generate such data by reading data from disk units of the same redundancy group in which no data is written. In this case, data are read out of (N−M) disk units. In this example, microprocessor 3 in control section 23 compares (M+1) with (N−M) and executes a processing based on one of the two methods by which data is written in fewer number of disk units.

As explained above, according to the present invention, there is provided an array-type recording device having a control section capable of altering disk units of which data are to be read out first for generating redundancy data depending on the number of writing disk units at the time of data writing operation.

In the device illustrated in FIG. 2, channel 10a and channel controller 8a constitute the first data transfer means, while channel 10b and channel controller 8b constitute the second data transfer means. Disk unit 9a is connected to two channels 10a and 10b. If access to the disk unit through one of the channels 10a becomes error, such access is switched to the other of the channels 10b, thereby enabling access to be completed. In this way, the occurrence of errors in channels may be avoided.

There may be more than two channels per channel controller and a plurality of channels may be controlled by one channel controller.

As explained above, according to the present invention, there is provided an array-type recording device wherein disk units arranged in an array are connected to an array controller by way of a plurality of channels, and wherein if access from the array controller to any disk unit by way of one of the channels results in error, another access to the disk unit can be achieved through another channel.

Channel 10a and channel controller 8a constitute the first data transfer means, while channel 10b and channel controller 8b constitute the second data transfer means. Disk unit 9a is connected to two channels 10a and 10b. Control section 23 may select and alter a channel path during the operation of the system. If one of the channels 10a is occupied and one of the disk units connected to channel 10a has been got access, when an access request for other disk unit connected to channel 10a is made, control section 23 enables access to this other disk unit by utilizing channel 10b. Thus, since control section 23 is capable of arbitrarily selecting and altering channels depending on the status thereof, an access time can be shortened, whereby the performance of the system may be enhanced.

As explained above, according to the present invention, there is provided an array-type recording device capable of selecting or altering, out of a plurality of channels, a channel path for enabling access to a disk unit connected to an array controller by way of a plurality of channels during operation of the system.

The array-type recording device illustrated in FIG. 2 may gave a plurality of stand-by disks 11 which replace any damaged disk units. It is, however, to be noted that, as stand-by disks may be damaged during rest, these stand-by disks 11 are periodically or irregularly diagnosed in a background operation under the control of maintenance diagnosis processor 20 (maintenance diagnosis means) shown in FIG. 2. As a result, if any abnormality is detected by the diagnosis processor, such a faulty stand-by disk is disabled and separated from the system. For this reason, such a situation that a disk unit is damaged during use and a stand-by disk to replace is also damaged can be avoided. Thus, an available stand-by disk is always ready for use.

Maintenance diagnosis means 20 includes a means for selecting and setting the number of stand-by disks and, using the result of periodical or irregular diagnosis of disk units, can reduce the number of stand-by disks when the system is found to be highly reliable, but can increase the number of stand-by disks when the system reliability drops.

It is also possible to hold such stand-by disks in an immediately available state or "hot" state. Alternatively, they can be held in a "cold" state, that is power supply is off except when the diagnosis is conducted or replacement of the stand-by disk is executed, or held in combination of the "hot" and "cold" states. If the stand-by disk units are held in the "cold" condition, the stand-by disk units can be energized in accordance with a command from maintenance diagnosis processor 20 during diagnosis by way of power supply control device 18, thereby enabling the diagnosis. After the completion of diagnosis, the stand-by disk units are deenergized to be held in the cold condition.

Holding the disk units in a cold condition reduces power consumption and prevents any shortening of the disk unit life due to rotation of the disks under an energized condition.

Alternatively, the disk units are held in an energized state but the disks of the disk units are not rotated according to commands from channel controllers 8a–8e in a normal condition. During diagnosis, the disks are rotated, and after the diagnosis, the disks are again stopped from rotating, thereby enabling a longer life. In this case, no special H/W is required for turning ON and OFF the power supply for the disk units.

As explained above, according to the present invention, there is provided an array-type recording device having stand-by disk units which may replace faulty disk units if constituent disk units fail, and a maintenance diagnosis means for diagnosing the stand-by disk units periodically or irregularly and for, when any abnormality is detected by the diagnosis, disabling and separating the stand-by disks from the system. A means for selecting and setting the number of stand-by disk units may be provided further.

The stand-by disk units may be held in a "hot" condition in which they are always available, in a "cold" condition in which power supply is turned off except during the time of diagnosis and replacement, or in combination of the "hot" and "cold" conditions.

The stand-by disks which have been held in a "cold" condition are energized at the time of diagnosis to conduct diagnosis and deenergized after the completion of diagnosis to be held in the "cold" condition.

Alternatively, the stand-by disk units which are held in a "cold" condition are held energized but the disks of the disk units are not rotated in a normal state. The disks are rotated during diagnosis and stopped rotation again after the completion of the diagnosis.

Figure 5:
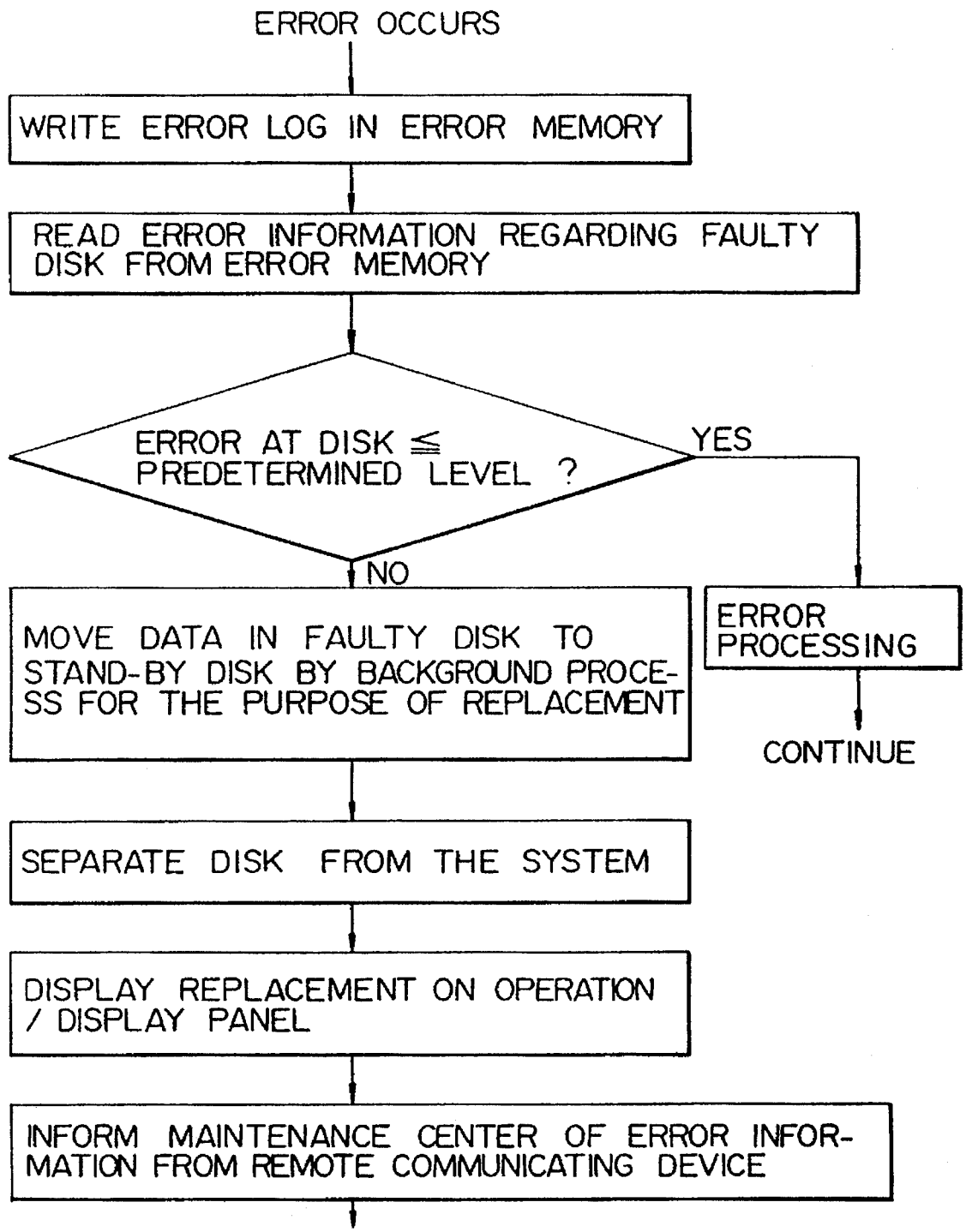
FIG. 5 is a flow chart showing still another operation of the embodiment shown in FIG. 2.

In the array-type recording device illustrated in FIG. 2, maintenance diagnosis processor 20 is adapted to collect error information on constituent disk units during the operation of the system and store the information in error storage means 19 comprising a magnetic disk unit and the like. As illustrated in FIG. 5, if any error exceeding a predetermined level occurs in a certain disk unit, the disk unit is predicted to be a possible faulty disk unit, and is replaced with a stand-by disk (by means of a background process or a foreground process), and the possible faulty disk unit is separated from the system. This fact is exhibited on operation display panel 21. Replacement of a disk unit with a stand-by disk is controlled by microprocessor 3 during the operation of the system by setting a replacement completion time depending on system performance requirements or a plurality of preferential replacement levels. Such a replacement process may be executed reducing any load imposed on the system by selecting a replacement completion time or any one of preferential replacement levels.

In addition to displaying a system status on operation display panel 21, a replacement process, a separation process and other status may be communicated to a maintenance center (not shown) by remote communicating device 22 as fault information. This arrangement enables quick maintenance such as exchange of separated disk units to be executed, whereby such a problem as shortage of stand-by disks may be prevented.

Maintenance diagnosis processor 20 may be substituted for a maintenance diagnosis program performed by microprocessor 3.

As explained above, according to the present invention, there is provided an array-type recording device having an error information storage means adapted to collect and store error information on constituent disk units during system operation, and a maintenance diagnosis means adapted to decide that a disk unit in which an error exceeding a predetermined level occurs is a possible faulty disk unit, replace the possible faulty unit with a stand-by disk unit and separate the possible faulty disk unit from the system.

The array-type recording device may further include a means for replacing a faulty disk unit with a stand-by disk unit during the operation of the system and a means for setting a replacement completion time in accordance with a system requirement or a plurality of preferential replacement process levels.

It is also possible to provide a remote communicating device which is capable of communicating replacement execution information or fault information of the array-type drive device with a maintenance center.

RAID level 5 in the case of allowing merely one faulty disk unit will next be explained with reference to FIG. 6. Disk devices 9a–9e constitute a redundancy group. If disk device 9b is damaged, it is replaced by stand-by disk 11. In stand-by disk 11, data is reconstructed sequentially from D1. When access is made to the data associated with unreconstructed data, the reconstruction of data may also be performed.

Figure 6:
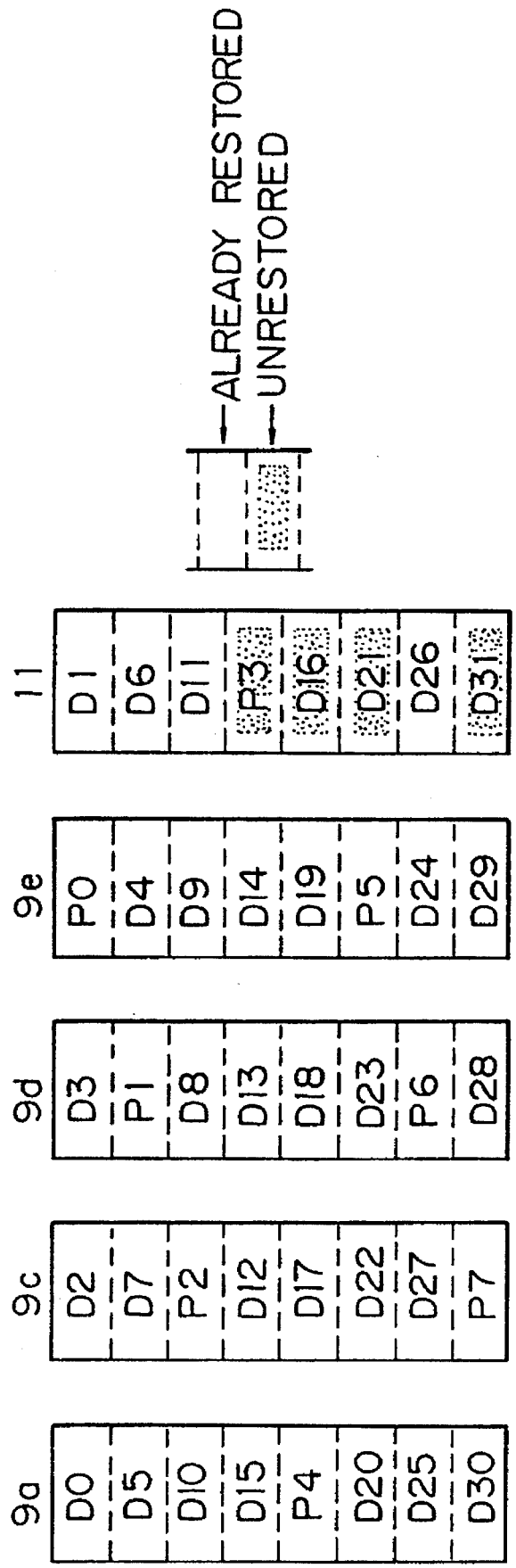
FIG. 6 illustrates the arrangement of data within a disk unit in the embodiment shown in FIG 2.

For example, in the condition shown in FIG. 6, if a request is made to read data 21, the data D20, D22, D23 and redundancy data P5 are read out to reconstruct data D21 which is in turn written in stand-by disk 11 and is transferred. At this time, after data D21 is reconstructed, and before data D21 is written in stand-by disk 11, the completion of data transfer and process is reported to host computer 1. Subsequently data D21 is written in stand-by disk 11 and reconstructed, whereby a rapid response may be attained.

If a request for writing to data D21 is made, data D20, D22, D23 are read out along with a new data D21 and new redundancy data P5 is generated. Those new redundancy data P5 and new data D21 are written respectively into disk unit 9e and stand-by disk 11, thereby attaining data reconstruction. Even before the writing of new data D21 into stand-by disk 11 is completed, the completion of writing operation may be reported to the host computer at the time of the completion of writing new redundancy data P5, whereby a rapid response may be realized.

When a request for reading data D17 is made, after data D17 is read out and transferred to host computer 1, data P4, D18 and D19 are read out and used, along with D17, to reconstruct data D16 which is then written in disk unit 11.

Furthermore, when a request for writing data D17 is made, old data D17 and old redundancy data P4 are read out to generate new redundancy data P4. Then new data D17 and new redundancy data P4 are written. In this respect, when the writing of both new data is completed, the completion of writing operation is reported to host computer 1, thereby realizing a rapid response. Data D18 and D19 are read out and used, along with data D17, to reconstruct data D16. Then, data D16 is written in stand-by disk 11.

It is to be noted that an access to such reconstructed data as data D6 may be made in a similar manner as access to normal data.

It is also to be noted that even if the writing of data into a stand-by disk fails, data can be reconstructed by using data read from other disk units of the same redundancy group.

In this way, by reconstructing data in stand-by disk unit 11 by taking into consideration access to data from host computer 1, a part of reading and writing processes for a reconstructing process may be performed with reading and writing processes accompanied with access to data from host computer 1, whereby the entire process can be reduced as compared to the case in which a reconstructing process is executed independently of access to data from host computer 1.

As described above, according to the present invention, there is provided an array-type recording device wherein if a constituent disk unit is damaged and the faulty disk unit is replaced by a stand-by disk during the operation of the system, an unreconstructed area may be reconstructed at times when access to the unreconstructed area of the faulty disk unit is made, or when access to an area of another disk unit of the same redundancy group which is involved in the unreconstructed area of the faulty disk unit, the unreconstructed area can be reconstructed.

If the above access is made for the purpose of reading data, a report as to transfer of data and the completion of reading process is made to the host computer when all the data to be read out are prepared, and thereafter data are reconstructed. On the other hand, if the above access is made for the purpose of writing data, a report as to the completion of writing process is made to the host computer when the writing of data into disk unit other than a stand-by disk in a redundancy group which replaces a faulty disk unit is completed, and then a reconstructing process is executed.

The present invention has been described with respect to the case of a failure in one disk unit. However, data can be reconstructed taking into consideration access to a disk unit constituting the same redundancy group, even if a failure in a plurality of disk units is allowed by the degree of redundancy.

In the array-type recording device shown in FIG. 2, when any of disk devices 9a–9e is damaged and the faulty disk unit is to be replaced by a stand-by disk, if the faulty disk unit includes any data area from which data may be read out without errors, then the data read out of such an area is written in stand-by disk 11 for reconstruction. This may be executed by maintenance diagnosis processor 20 or microprocessor 8.

For example, even if scratches are formed across a plurality of tracks on a disk in a disk unit, resulting in a soft crash state, the data stored on the remaining portions of the tracks may be read out. If a faulty disk unit includes any area from which data can be read out without errors, quicker reconstruction may be realized by utilizing data read out of such an area rather than by reading data from another disk units of the same redundancy group. However, data corresponding to such areas as may cause any error in data may be reconstructed by reading data from other disk units of the same redundancy group.

As described above, according to the present invention, there is provided an array-type recording device having a replacing means for, if a constituent disk unit is damaged and such a faulty disk unit is to be replaced by a stand-by disk, if the faulty disk unit includes any area from which data can be read out without any error, utilizing the data read from such an area, and, utilizing instead of data corresponding the areas other than the above area, data reconstructed from data of other disk units of the redundancy group including the faulty disk unit.

Although an example of an array-type disk drive device has been described with reference to the drawings, the present invention can be implemented in a variety of manners. For example, an array-type recording device may be constructed on the basis of other RAID levels 1–5.

What is claimed is:

1. A recording device, comprising:

a plurality of recording sections for recording data;

alternative recording units to be used in place of a recording section of the plurality of recording sections; and a maintenance diagnosis means for occasionally diagnosing, prior to determining a need to replace a recording section, said alternative recording units to decide whether any of said alternative recording units are usable to replace a recording section;

wherein said alternative recording units are held in one of three conditions, a first condition being continuously available for use, a second condition being deenergized and disabled except for at a time of diagnosis or replacement, and a third condition wherein said alternative recording units are kept energized with physical operation of said recording section normally being stopped, and, while diagnosis is executed, said recording section is operated and then is stopped again after the diagnosis is completed.

2. The recording device as claimed in claim 1 further comprising a means for selecting and setting the number of said alternative recording units.

3. The recording device as claimed in claim 1 wherein the conditions in which said alternative recording units are held are selectable.

4. The recording device as claimed in claim 1 wherein said alternative recording units in the second condition are energized at the time of diagnosis and deenergized after the completion of diagnosis so as to be held in a power-off condition.

5. The recording device as claimed in claim 1 further comprising an error recording means for recording error information during recording data in and reproducing data from said recording section, wherein said maintenance diagnosis means is operable to decide whether said recording section should be replaced with said alternative recording unit in accordance with the error information recorded in said error recording means.

6. The recording device as claimed in claim 5, wherein said recording section includes means for replacing said alternative recording unit during the operation of the system and includes means for setting a replacement completion time.

7. The recording device as claimed in claim 5 further comprising a remote communication means for communicating information about a replacement or fault about said recording device to an external location such as a maintenance center.

* * * * *

UNITED STATES PATENT AND TRADEMARK OFFICE

CERTIFICATE OF CORRECTION

PATENT NO. : 5,655,150

DATED : August 5, 1997

INVENTOR(S): Toshio Matsumoto and Hiroshi Baba

It is certified that error appears in the above-identified patent and that said Letters Patent is hereby corrected as shown below:

On the title page: Item

[30] please change "Jul. 17, 1992" to -- April 11, 1991 --.

Signed and Sealed this

Ninth Day of December, 1997

*Attest:*

BRUCE LEHMAN

*Attesting Officer*     *Commissioner of Patents and Trademarks*